US009178010B2

(12) United States Patent
Malhotra et al.

(10) Patent No.: US 9,178,010 B2
(45) Date of Patent: Nov. 3, 2015

(54) ADSORPTION SITE BLOCKING METHOD FOR CO-DOPING ALD FILMS

(71) Applicants: Intermolecular, Inc., San Jose, CA (US); Elpida Memory, Inc., Tokyo (JP)

(72) Inventors: Sandra Malhotra, Fort Collins, CO (US); Hanhong Chen, Milpitas, CA (US); Wim Deweerd, San Jose, CA (US); Toshiyuki Hirota, Higashihiroshima (JP); Hiroyuki Ode, Higashihiroshima (JP)

(73) Assignee: Intermolecular, Inc., San Jose, CA (US)

( * ) Notice: Subject to any disclaimer, the term of this patent is extended or adjusted under 35 U.S.C. 154(b) by 245 days.

(21) Appl. No.: 13/693,901

(22) Filed: Dec. 4, 2012

(65) Prior Publication Data

US 2013/0119513 A1    May 16, 2013

Related U.S. Application Data

(63) Continuation of application No. 13/294,341, filed on Nov. 11, 2011, now Pat. No. 8,440,537.

(51) Int. Cl.
| | |
|---|---|
| *H01L 27/108* | (2006.01) |
| *H01L 29/94* | (2006.01) |
| *H01L 49/02* | (2006.01) |
| *H01L 21/02* | (2006.01) |
| *C23C 16/455* | (2006.01) |
| *H01L 29/423* | (2006.01) |

(52) U.S. Cl.
CPC .......... *H01L 28/60* (2013.01); *C23C 16/45534* (2013.01); *H01L 21/0228* (2013.01); *H01L 21/02175* (2013.01); *H01L 21/02178* (2013.01); *H01L 21/02186* (2013.01); *H01L 21/02189* (2013.01); *H01L 21/02194* (2013.01); *H01L 28/40* (2013.01); *H01L 27/10852* (2013.01); *H01L 28/56* (2013.01); *H01L 29/4234* (2013.01)

(58) Field of Classification Search
CPC ................ H01L 21/28194; H01L 21/3141; H01L 29/517; H01L 29/4324
USPC .................. 257/532, 303; 438/381, 395, 399
See application file for complete search history.

(56) References Cited

U.S. PATENT DOCUMENTS

| | | | | |
|---|---|---|---|---|
| 2001/0011743 | A1* | 8/2001 | Arita et al. .................... | 257/314 |
| 2004/0137645 | A1* | 7/2004 | Hu et al. ........................... | 438/3 |
| 2005/0175789 | A1* | 8/2005 | Helms, Jr. et al. ............ | 427/457 |
| 2006/0110930 | A1* | 5/2006 | Senzaki ......................... | 438/758 |
| 2006/0228868 | A1* | 10/2006 | Ahn et al. ...................... | 438/453 |
| 2008/0237791 | A1* | 10/2008 | Boescke et al. ............... | 257/532 |
| 2010/0330269 | A1* | 12/2010 | Chen et al. .................... | 427/123 |
| 2013/0052792 | A1* | 2/2013 | Malhotra ................ | H01L 28/40 438/396 |

* cited by examiner

*Primary Examiner* — Zandra Smith
*Assistant Examiner* — John M Parker

(57) ABSTRACT

A method for doping a dielectric material by pulsing a first dopant precursor, purging the non-adsorbed precursor, pulsing a second precursor, purging the non-adsorbed precursor, and pulsing a oxidant to form an intermixed layer of two (or more) metal oxide dielectric dopant materials. The method may also be used to form a blocking layer between a bulk dielectric layer and a second electrode layer. The method improves the control of the composition and the control of the uniformity of the dopants throughout the thickness of the doped dielectric material.

16 Claims, 4 Drawing Sheets

ADSORPTION SITE BLOCKING METHOD FOR CO-DOPING ALD FILMS

CROSS-REFERENCE TO RELATED APPLICATIONS

This application is a Continuation Application of U.S. patent application Ser. No. 13/294,341, filed on Nov. 11, 2011, which is herein incorporated by reference for all purposes.

This document relates to the subject matter of a joint research agreement between Intermolecular, Inc. and Elpida Memory, Inc.

FIELD OF THE INVENTION

The present invention generally relates to the field of dynamic random access memory (DRAM), and more particularly to dielectric material processing for improved DRAM performance.

BACKGROUND OF THE INVENTION

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d (i.e. the physical thickness of the dielectric layer), and the relative dielectric constant or k-value of the dielectric material. The capacitance is given by:

$$C = \kappa \varepsilon_o \frac{A}{d} \qquad \text{(Eqn. 1)}$$

where $\varepsilon_o$ represents the vacuum permittivity.

The dielectric constant is a measure of a material's polarizability. Therefore, the higher the dielectric constant of a material, the more charge the capacitor can hold. Therefore, if the k-value of the dielectric is increased, the area of the capacitor can be decreased and maintain the desired cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally $<10^{-7}$ A cm$^{-2}$). The physical thickness of the dielectric layers in DRAM capacitors could not be reduced unlimitedly in order to avoid leakage current caused by tunneling mechanisms which exponentially increases as the thickness of the dielectric layer decreases.

Traditionally, SiO$_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the SiO$_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

One class of high-k dielectric materials possessing the characteristics required for implementation in advanced DRAM capacitors are high-k metal oxide materials. Examples of suitable dielectric materials comprise Al$_2$O$_3$, BaSrTiO$_x$ (BST), HfO$_2$, HfSiO$_x$, Nb$_2$O$_5$, PbZrTiO$_x$ (PZT), SiO$_2$, a bilayer of SiO$_2$ and Si$_x$N$_y$, SiON, SrTiO$_3$ (STO), Ta$_2$O$_5$, TiO$_2$, ZrO$_2$, etc. TiO$_2$ and ZrO$_2$ are two specific examples of metal oxide dielectric materials which display significant promise in terms of serving as a high-k dielectric material for implementation in DRAM capacitors.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. TiN), or combinations thereof. MIM capacitors in these DRAM applications utilize insulating materials having a dielectric constant, or k-value, significantly higher than that of SiO$_2$ (k=3.9). For DRAM capacitors, the goal is to utilize dielectric materials with k values greater than about 40. Such materials are generally classified as high-k materials. Representative examples of high-k materials for MIM capacitors are non-conducting metal oxides, non-conducting metal nitrides, non-conducting metal silicates or combinations thereof. These dielectrics may also include additional dopant materials.

A figure of merit in DRAM technology is the electrical performance of the dielectric material as compared to SiO$_2$ known as the Equivalent Oxide Thickness (EOT). A high-k material's EOT is calculated using a normalized measure of silicon dioxide (SiO$_2$ k=3.9) as a reference, given by:

$$EOT = \frac{3.9}{\kappa} \cdot d \qquad \text{(Eqn. 2)}$$

where d represents the physical thickness of the capacitor dielectric.

As DRAM technologies scale below the 40 nm technology node, manufacturers must reduce the EOT of the high-k dielectric films in MIM capacitors in order to increase charge storage capacity. The goal is to utilize dielectric materials that exhibit an EOT of less than about 0.8 nm while maintaining a physical thickness of about 5-20 nm.

Generally, as the dielectric constant of a material increases, the band gap of the material decreases. For example. The rutile phase of TiO$_2$ has a k-value of about 80 and a band gap of about 3.0 eV while ZrO$_2$ in the tetragonal phase has a k-value of about 43 and a band gap of about 5.8 eV. The low band gap may lead to high leakage current in the device. As a result, without the utilization of countervailing measures, capacitor stacks implementing high-k dielectric materials may experience large leakage currents. High work function electrodes (e.g., electrodes having a work function of greater than 5.0 eV) may be utilized in order to counter the effects of implementing a reduced band gap high-k dielectric layer within the DRAM capacitor. Metals, such as platinum, gold, ruthenium, and ruthenium oxide are examples of high work function electrode materials suitable for inhibiting device leakage in a DRAM capacitor having a high-k dielectric layer. The noble metal systems, however, are prohibitively expensive when employed in a mass production context. Moreover, electrodes fabricated from noble metals often suffer from poor manufacturing qualities, such as surface roughness, poor adhesion, and form a contamination risk in the fab.

Leakage current in capacitor dielectric materials can be due to Schottky emission, Frenkel-Poole defects (e.g. oxygen vacancies ($V_{ox}$) or grain boundaries), or Fowler-Nordheim tunneling. Schottky emission, also called thermionic emission, is a common mechanism and is the thermally activated flow of charge over an energy barrier whereby the effective barrier height of a MIM capacitor controls leakage current. The nominal barrier height is a function of the difference between the work function of the electrode and the electron affinity of the dielectric. The electron affinity of a dielectric is closely related to the conduction band offset of the dielectric. The Schottky emission behavior of a dielectric layer is generally determined by the properties of the dielectric/electrode interface. Frenkel-Poole emission allows the conduction of charges through a dielectric layer through the interaction with defect sites such as vacancies, grain boundaries, and the like. As such, the Frenkel-Poole emission behavior of a dielectric layer is generally determined by the dielectric layer's bulk properties. Fowler-Nordheim emission allows the conduction of charges through a dielectric layer through direct tunneling without any intermediary interaction with e.g. defects. As such, the Fowler-Nordheim emission behavior of a dielectric layer is generally determined by the physical thickness of the dielectric layer. This leakage current is a primary driving force in the adoption of high-k dielectric materials. The use of high-k materials allows the physical thickness of the dielectric layer to be as thick as possible while maintaining the required capacitance (see Eqn 1 above).

High k metal oxide materials generally possess a number of defects in the form of oxygen vacancies. As an example, $TiO_2$ is well known to exhibit n-type material properties due to the presence of oxygen vacancies. The defects contribute trap states within the band gap of the material and increase the leakage current due to the Frenkel-Poole emission mechanism discussed previously. Also, the carrier density is increased since the oxygen vacancies also act as donors. Annealing the dielectric material in an oxidizing atmosphere after deposition will improve the leakage current; however, oxygen vacancies will still be present. One method for further decreasing the leakage current in high k dielectric materials is to add dopants to the material to compensate the carriers generated from the defects or vacancies. Examples of dopants for $TiO_2$ dielectric materials comprise Al, Ce, Co, Er, Ga, Gd, Ge, Hf, In, La, Lu, Mg, Mn, Nd, Pr, Sc, Si, Sn, Sr, Y, Zr, or combinations thereof. As an example, since $TiO_2$ is an n-type material, acceptor dopants such as Al and Ge are often used to decrease the leakage current. These dopants are trivalent and neutralize the free carriers generated by the oxygen vacancies. They are believed to be substitutional donors for Ti when added to the $TiO_2$. However, Al and Ge are small atoms, have limited solubility in $TiO_2$, and their incorporation distorts the $TiO_2$ matrix. Even after doping the $TiO_2$ with Al or Ge, at elevated temperatures, free carriers again become available and the leakage current increases.

A second (or more) dopant has sometimes been added to the doped $TiO_2$ to further decrease the leakage current. Typically, the second dopant has an ionic radius that is larger than the first dopant. However, the control of the composition and the control of the uniformity of the composition through the depth of the material are difficult using traditional processing schemes. Therefore, there is a need to develop methods for improving the incorporation and control of the dopants when two or more dopants are incorporated into a high k dielectric material.

SUMMARY OF THE DISCLOSURE

In some embodiments of the present invention, a first material operable as a first electrode of a capacitor stack is formed above a substrate. A second material operable as a first dielectric of a capacitor stack is formed above the first material. A third material operable as a second dielectric of a capacitor stack is formed above the second material and the third material is formed from a method comprising the steps of: a) A first dopant precursor is pulsed to expose the surface to the first dopant and forms a sub-monolayer of adsorbed dopant species. The remaining first dopant precursor is purged from the reaction zone. b) A second dopant precursor is pulsed to expose the surface to the second dopant and adsorbs onto reactive sites that are not blocked by the presence of the first dopant. The remaining second dopant precursor is purged from the reaction zone. c) An oxidant species is pulsed to react with the adsorbed first dopant and the adsorbed second dopant to convert them to an integrated metal oxide second dielectric material. A fourth material operable as a third dielectric of a capacitor stack is formed above the third material. This sequence is repeated as many times as required to form the desired thickness and composition of the dielectric material of the capacitor stack. A fifth material operable as a second electrode of a capacitor stack is formed above the fourth material. The metal ion of the first precursor and the metal ion of the second precursor may have different sizes. Advantageously, one metal ion has a large ionic radius and the other metal ion has a smaller ionic radius. Advantageously, the second material and the fourth material comprise the same dielectric materials.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed.

Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Figure 1:
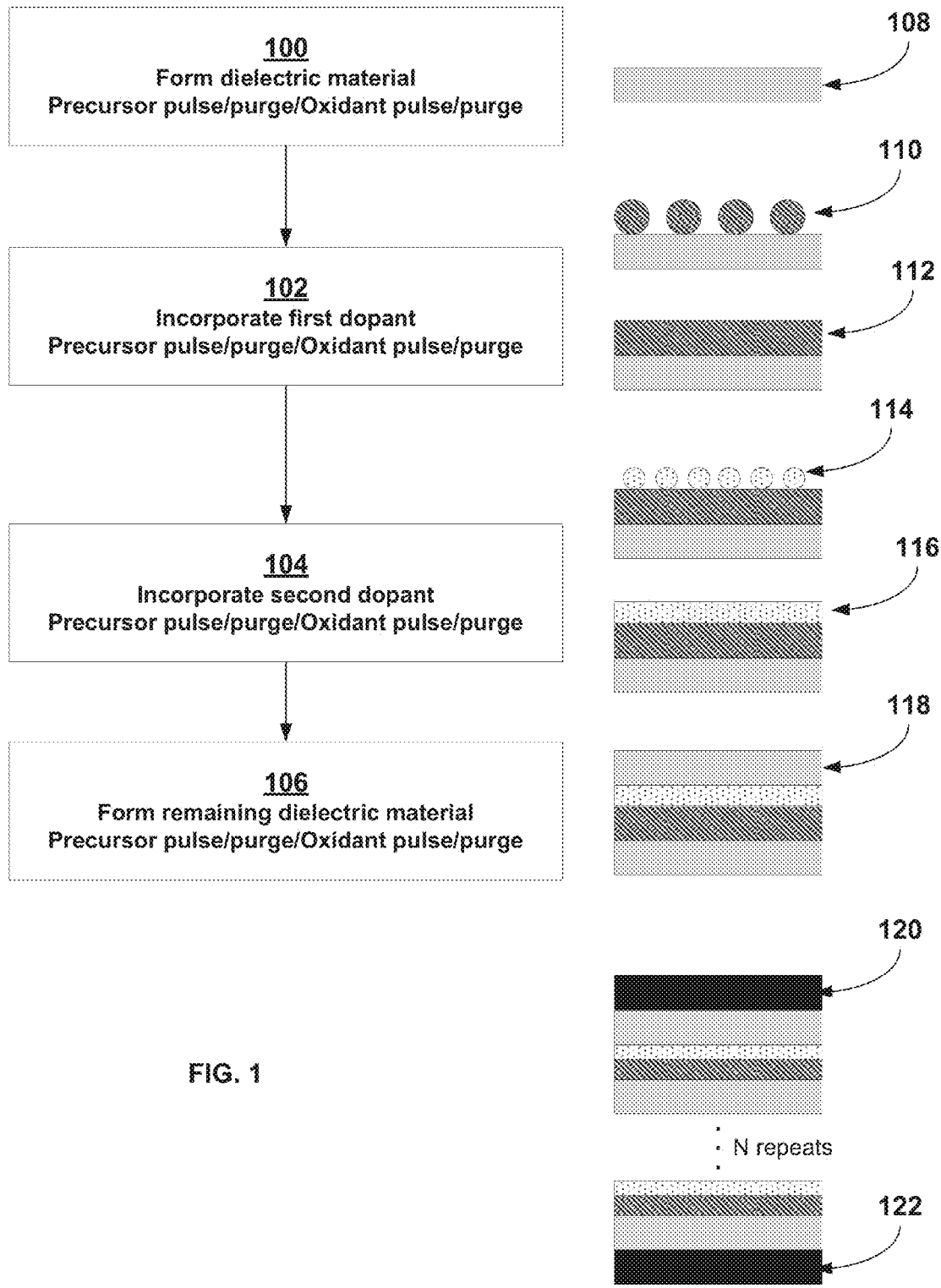
FIG. 1 illustrates a flow chart and a schematic of conventional ALD deposition of doped dielectric materials.
Figure 2:
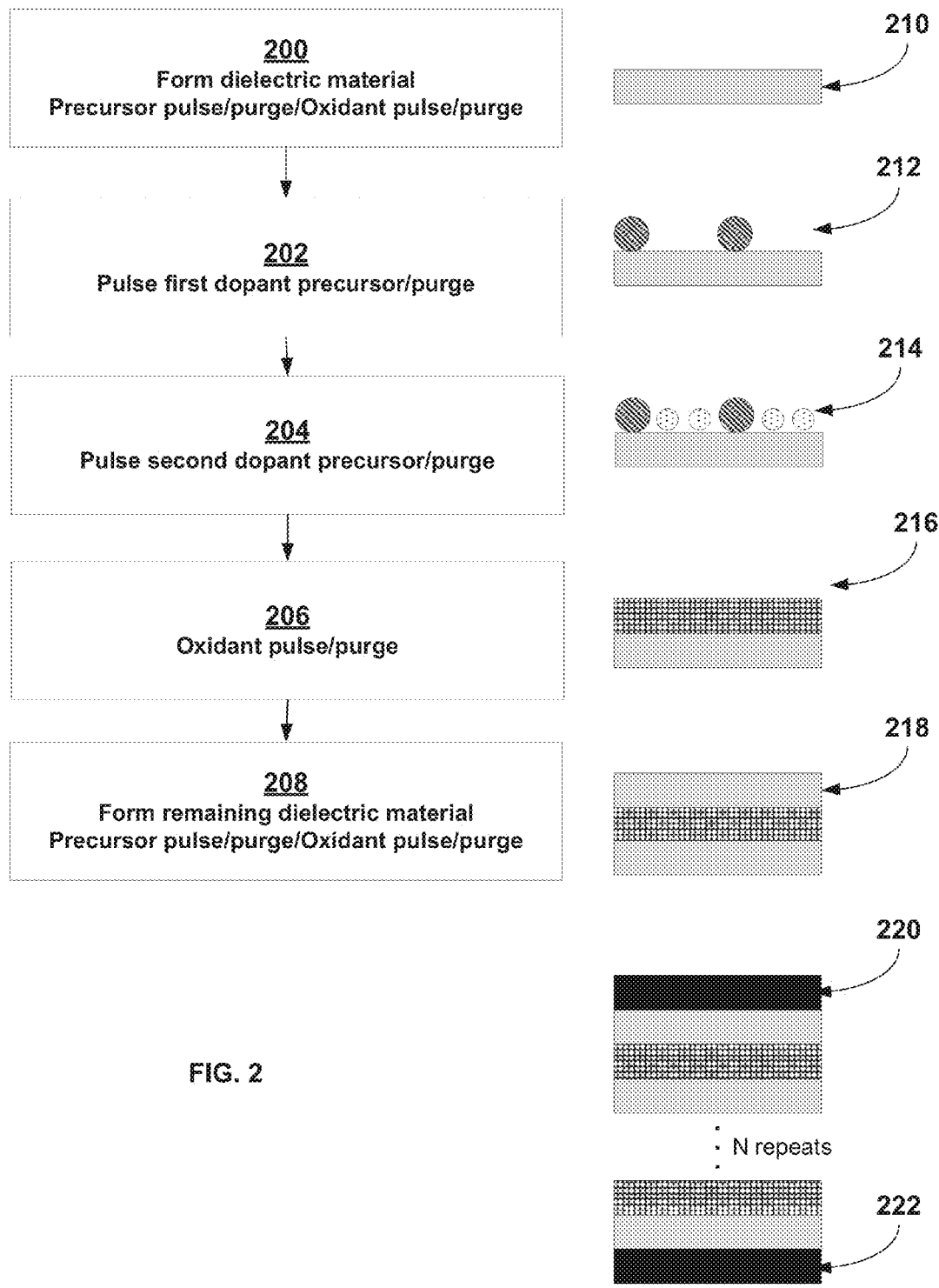
FIG. 2 illustrates a flow chart and a schematic of ALD deposition of doped dielectric materials according to some embodiments of the present invention.
Figure 3:
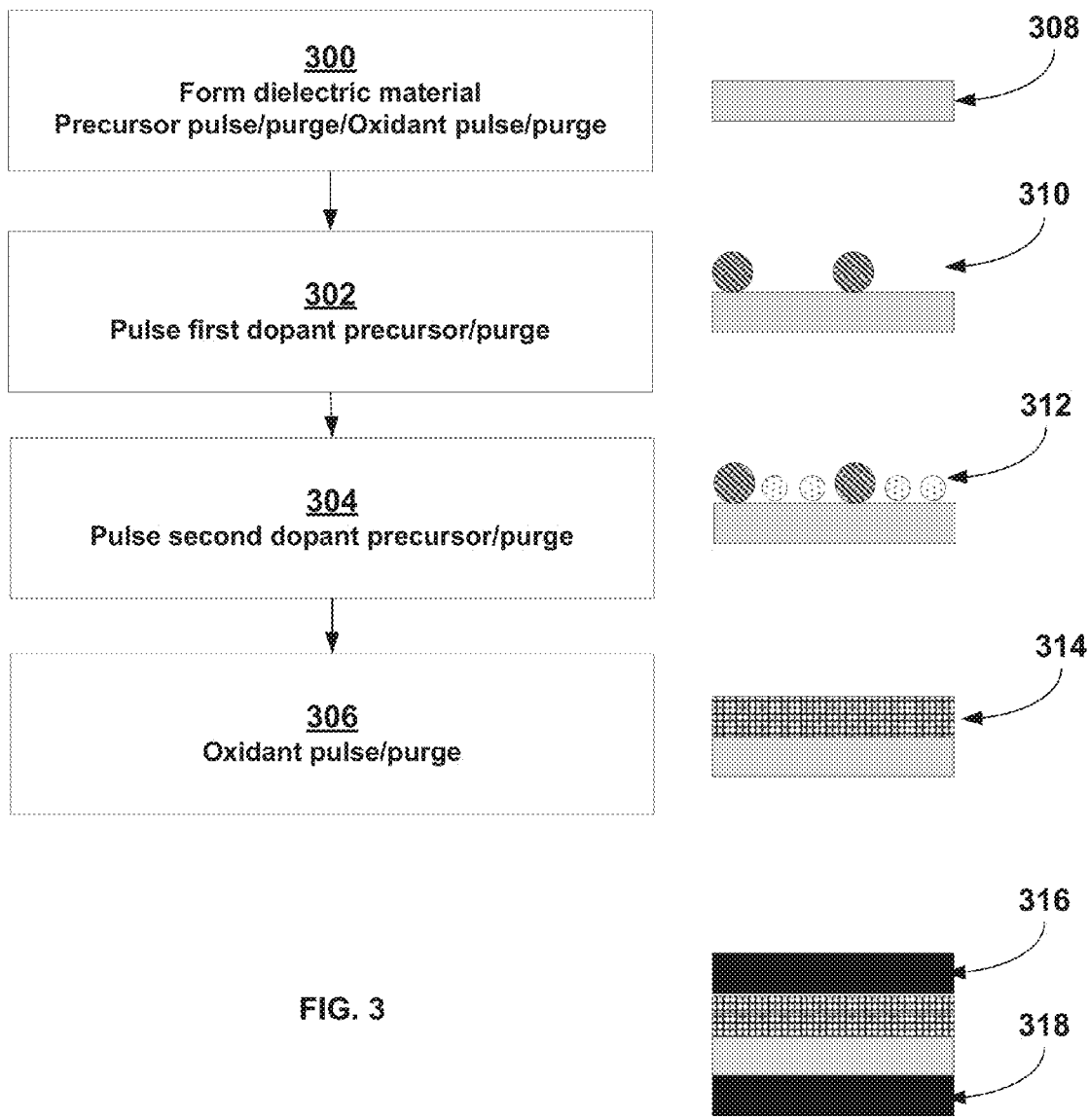
FIG. 3 illustrates a flow chart and a schematic of ALD deposition of doped dielectric materials according to some embodiments of the present invention.

In FIGS. 1-3 below, a capacitor stack is illustrated using a simple planar structure. Those skilled in the art will appreciate that the description and teachings to follow can be readily applied to any simple or complex capacitor morphology. The drawings are for illustrative purposes only and do not limit the application of the present invention.

DRAM MIM capacitors generally comprise a dielectric material disposed between a first electrode layer and a second electrode layer. Those skilled in the art will appreciate that each of the first electrode layer, the dielectric material, and the second electrode layer used in the MIM DRAM capacitor may be formed using any common formation technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Generally, because of the complex morphology of the DRAM capacitor structure, ALD, PE-ALD, AVD, or CVD are preferred methods of formation. However, any of these techniques are suitable for forming each of the various layers discussed below. Those skilled in the art will appreciate that the teachings described below are not limited by the technology used for the deposition process.

FIG. 1 illustrates a flow chart and a schematic of conventional ALD deposition of doped dielectric materials. This sequence only discusses the steps involved in the formation of the dielectric materials of the capacitor stack. In step 100, a portion of the dielectric material, 108, is formed using a convention ALD process sequence. In this sequence, the dielectric material precursor is pulsed into the reaction zone. A portion of the precursor adsorbs onto the surface at reactive sites. The remainder of the precursor is purged from the reaction zone. An oxidant is then pulsed into the reaction zone to react with the adsorbed precursor and form a metal oxide dielectric material. This sequence is repeated until the desired thickness of the dielectric material is formed. Examples of suitable dielectric materials comprise $Al_2O_3$, $BaSrTiO_x$ (BST), $HfO_2$, $HfSiO_x$, $Nb_2O_5$, $PbZrTiO_x$ (PZT), $SiO_2$, a bilayer of $SiO_2$ and $Si_xN_y$, SiON, $SrTiO_3$ (STO), $Ta_2O_5$, $TiO_2$, $ZrO_2$, etc.

In step 102, a first precursor that represents a dopant with a metal having a large ionic radius is pulsed into the reaction zone. A portion of the precursor adsorbs onto the surface at reactive sites, 110. The remainder of the precursor is purged from the reaction zone. An oxidant is then pulsed into the reaction zone to react with the adsorbed precursor and form a metal oxide dielectric material, 112 that acts as a dopant.

In step 104, a second precursor that represents a dopant with a metal having a small ionic radius is pulsed into the reaction zone. A portion of the precursor adsorbs onto the surface at reactive sites, 114. The remainder of the precursor is purged from the reaction zone. An oxidant is then pulsed into the reaction zone to react with the adsorbed precursor and form a metal oxide dielectric material, 116 that also acts as a dopant. After this step, there is a dopant layer that compromises two dopant species layers on the initial dielectric material. Steps similar to 102 or 104 are repeated if more than two dopants are to be incorporated. Examples of dopants for steps 102 and 104 comprise Al, Ce, Co, Er, Ga, Gd, Ge, Hf, In, La, Lu, Mg, Mn, Nd, Pr, Sc, Si, Sn, Sr, Ti, Y, Zr, or combinations thereof.

In step 106, a remaining portion of the dielectric material, 118, is formed using a convention ALD process sequence. In this sequence, the dielectric material precursor is pulsed into the reaction zone. A portion of the precursor adsorbs onto the surface at reactive sites. The remainder of the precursor is purged from the reaction zone. An oxidant is then pulsed into the reaction zone to react with the adsorbed precursor and form a metal oxide dielectric material. This sequence is repeated until the desired thickness of the remaining dielectric material is formed. Typically, the dielectric material formed in step 106 is the same dielectric material that is formed in step 100. However, the present invention is not limited to this configuration. In some embodiments of the present invention, the dielectric material formed in step 106 is different from the dielectric material that is formed in step 100.

This sequence (100-106) may be repeated many times to form a dielectric material with various nanolaminate layers of the two dopants embedded within the material. The dielectric material within the MIM capacitor stack is generally disposed between two electrode layers, 120, and 122.

Although sequence 100-106 is effective at incorporating two or more dopants into the dielectric material, the sequence is not effective at controlling the composition and uniformity of the dopant incorporation. As an example, there may be fewer reaction sites available for larger dopant metal ions because of their size. Therefore, it may be difficult to increase the level of doping for these dopants. Conversely, there may be too many reaction sites available for smaller dopant metal ions because of their size. Therefore, it may be difficult to keep the level of doping for these dopants below a certain level. Additionally, the two (or more) dopant layers may not interdiffuse during subsequent anneal steps and the full benefit of the doping may not be realized with regard to lowering the leakage current.

FIG. 2 illustrates a flow chart and a schematic of an ALD deposition of doped dielectric materials according to some embodiments of the present invention. This sequence only discusses the steps involved in the formation of the dielectric materials of the capacitor stack. In this example, a three layer dielectric material will be described. Those skilled in the art will understand that there will have been at least a first electrode material formed on the substrate prior to the formation of the dielectric materials. In step 200, a first dielectric material, 210, is formed using a convention ALD process sequence. In this sequence, the first dielectric material precursor is pulsed into the reaction zone. A portion of the precursor adsorbs onto the surface at reactive sites. The remainder of the precursor is purged from the reaction zone. An oxidant is then pulsed into the reaction zone to react with the adsorbed precursor and form a metal oxide dielectric material. This sequence is repeated until the desired thickness of the first dielectric material is formed. Examples of suitable dielectric materials comprise $Al_2O_3$, $BaSrTiO_x$ (BST), $HfO_2$, $HfSiO_x$, $Nb_2O_5$, $PbZrTiO_x$ (PZT), $SiO_2$, a bilayer of $SiO_2$ and $Si_xN_y$, SiON, $SrTiO_3$ (STO), $Ta_2O_5$, $TiO_2$, $ZrO_2$, etc.

In step 202, a first precursor that represents a dopant with a metal having a large ionic radius is pulsed into the reaction zone. A portion of the first precursor adsorbs onto the surface at reactive sites, 212. The remainder of the first precursor is purged from the reaction zone. Advantageously, the ionic radius of the metal ion in the first precursor is larger than the ionic radius of the metal ion in the first dielectric material.

In step 204, a second precursor that represents a dopant with a metal having a small ionic radius is pulsed into the reaction zone. A portion of the second precursor adsorbs onto the surface at reactive sites, 214 that were not occupied by the first precursor that represents a dopant with a metal having a large ionic radius. The remainder of the second precursor is purged from the reaction zone. Advantageously, the ionic radius of the metal ion in the second precursor is smaller than the ionic radius of the metal ion in the first dielectric material. Steps similar to 202 or 204 are repeated if more than two dopants are to be incorporated. This method is herein designated as an Adsorption Site Blocking (ASB) method. Examples of dopants for steps 202 and 204 comprise Al, Ce, Co, Er, Ga, Gd, Ge, Hf, In, La, Lu, Mg, Mn, Nd, Pr, Sc, Si, Sn, Sr, Ti, Y, Zr, or combinations thereof.

In step 206, an oxidant is then pulsed into the reaction zone to react with the adsorbed precursors (both kinds) and form a metal oxide second dielectric material, 216, that represents a mixture of the two (or more) dopants. After this step, there is a dopant layer that compromises two (or more) dopant species layers on the first dielectric material.

In step 208, a third dielectric material, 218, is formed using a convention ALD process sequence. In this sequence, the third dielectric material precursor is pulsed into the reaction zone. A portion of the precursor adsorbs onto the surface at reactive sites. The remainder of the precursor is purged from the reaction zone. An oxidant is then pulsed into the reaction zone to react with the adsorbed precursor and form a metal oxide third dielectric material. This sequence is repeated until the desired thickness of the remaining third dielectric material is formed.

This sequence (202-208) may be repeated many times to form a dielectric material with a desired number of nanolaminate layers of the two (or more) dopants embedded within the material. Those skilled in the art will understand that there will be at least a second electrode material formed above the dielectric materials after the formation of the dielectric materials. The dielectric material within the MIM capacitor stack is generally disposed between two electrode layers, 220, and 222.

The ASB method is effective at controlling the composition and uniformity of the dopant incorporation. As an example, the first (i.e. large metal ion) precursor may be used to block reaction sites and control the adsorption and incorporation of the second (i.e. smaller metal ion) dopant. Additionally, the two (or more) dopant layers may fully interdiffuse during subsequent anneal steps and the full benefit of the doping may be realized with regard to lowering the leakage current when the ASB method is used. Without being limited by theory, in conventional ALD sequences wherein each of the two or more dopants are oxidized after their pulses, they tend to form as individual layers within the dielectric stack. Depending on the size difference between the metal ions in the dopant layer and the metal ions in the bulk dielectric layer, this may introduce distortion and stress at the interfaces. Furthermore, the dopants may not diffuse throughout the bulk dielectric layer and their benefit in lowering the leakage current may not be fully realized. In contrast, the use of the ASB method will tend to form dopant layers that more fully conform and match the bulk dielectric interface. Furthermore, the two or more dopants are more likely to diffuse throughout the dielectric layer and their benefit in lowering the leakage current may be fully realized.

Although the sequence (202-208) is illustrated and was described wherein the larger metal ion dopant was introduced first, the ASB method also works wherein the smaller metal ion dopant is introduced first. In this sequence, the concentration of the smaller metal ion dopant would be increased at the expense of the larger metal ion dopant. Although the designations "large" and "small" have been used, the physical size of the metal ions may not be the criteria used to select them. In some embodiments, the metal ions of the dopants may be of similar size.

One of the practical outcomes of the ASB method is that the deposition rate of the dopant materials changes based on the surface upon which it is being deposited. As an example, $ZrO_2$ can be doped with $Er_2O_3$ using the ASB method applied to ALD deposition technology. For the sequence, Zr—Er—$O_3$ (i.e. the Zr precursor is pulsed first), the deposition rate of the $Er_2O_3$ is about 0.15 A/cycle and the deposition rate of the $ZrO_2$ is about 0.80 A/cycle. For the sequence, Er—Zr—$O_3$ (i.e. the Er precursor is pulsed first), the deposition rate of the $Er_2O_3$ is about 0.64 A/cycle and the deposition rate of the $ZrO_2$ is about 0.75 A/cycle. This data indicate that the deposition rate of the $Er_2O_3$ is very sensitive to sequence in which it is applied. This difference in deposition rate may be used to control the relative amount of $Er_2O_3$ that is incorporated into the film. Similar results have been observed for the co-doping of $Er_2O_3$ and $Al_2O_3$ in a $TiO_2$ dielectric material. The $Al_2O_3$ deposition rate drops by about 60% if the Er precursor is pulsed first. The $Er_2O_3$ deposition rate drops by about 50% if the Al precursor is pulsed first. Most of the metal precursor molecules are based on amine or cyclopentadiene functional groups. Therefore, similar results are expected for a wide range of pairs of dopants. It is also expected that similar trends would be observed if three or more dopants were incorporated into the dielectric material.

FIG. 2 and the accompanying description highlights the use of the ASB method to incorporate two or more dopants into the bulk of the dielectric material. In other embodiments, the ASB method for introducing two or more metal oxide components may be applied to the formation of a blocking layer formed between the dielectric material and the second electrode. Generally, the blocking layer will be a dielectric material with a k value between about 10 and about 30 and will have a band gap that is higher than the dielectric material. The presence of the blocking layer will reduce the leakage current of the capacitor.

FIG. 3 illustrates a flow chart and a schematic of ALD deposition of a blocking layer according to some embodiments of the present invention. This sequence only discusses the steps involved in the formation of the dielectric materials of the capacitor stack. In this example, a two layer dielectric material will be described. Those skilled in the art will understand that there will have been at least a first electrode material formed on the substrate prior to the formation of the dielectric materials. In step 300, the first dielectric material, 308, is formed using a convention ALD process sequence. In this sequence, the first dielectric material precursor is pulsed into the reaction zone. A portion of the precursor adsorbs onto the surface at reactive sites. The remainder of the precursor is purged from the reaction zone. An oxidant is then pulsed into the reaction zone to react with the adsorbed precursor and form a metal oxide first dielectric material. This sequence is repeated until the desired thickness of the first dielectric material is formed. Examples of suitable dielectric materials comprise $Al_2O_3$, $BaSrTiO_x$ (BST), $HfO_2$, $HfSiO_x$, $Nb_2O_5$, $PbZrTiO_x$ (PZT), $SiO_2$, a bilayer of $SiO_2$ and $Si_xN_y$, SiON, $SrTiO_3$ (STO), $Ta_2O_5$, $TiO_2$, $ZrO_2$, etc. The first dielectric material may be doped using conventional methods or the ASB method as described previously. Examples of dopants comprise Al, Ce, Co, Er, Ga, Gd, Ge, Hf, In, La, Lu, Mg, Mn, Nd, Pr, Sc, Si, Sn, Sr, Ti, Y, Zr, or combinations thereof.

In step 302, a first precursor that represents a metal ion with a large ionic radius is pulsed into the reaction zone. A portion of the first precursor adsorbs onto the surface at reactive sites, 310. The remainder of the precursor is purged from the reaction zone. Advantageously, the ionic radius of the metal ion in the first precursor is larger than the ionic radius of the metal ion in the first dielectric material.

In step 304, a second precursor that represents a metal ion with a small ionic radius is pulsed into the reaction zone. A portion of the second precursor adsorbs onto the surface at reactive sites, 312 that were not occupied by the first precursor. The remainder of the second precursor is purged from the reaction zone. Advantageously, the ionic radius of the metal ion in the second precursor is smaller than the ionic radius of the metal ion in the first dielectric material. Steps similar to 302 or 304 are repeated if more than two precursors are to be incorporated. Examples of precursors for steps 302 and 304 comprise Al, Ce, Co, Er, Ga, Gd, Ge, Hf, In, La, Lu, Mg, Mn, Nd, Pr, Sc, Si, Sn, Sr, Ti, Y, Zr, or combinations thereof.

In step 306, an oxidant is then pulsed into the reaction zone to react with the adsorbed precursors (both kinds) and form a metal oxide second dielectric material, 314, that represents a mixture of the two (or more) precursors. After this step, there is a second dielectric material that compromises two (or more) precursor species on the first dielectric material. Steps 302-306 are repeated as necessary to form a desired thickness of the second dielectric material. The first dielectric material and the second dielectric material within the capacitor stack are generally disposed between two electrode layers, 316, and 318.

The ASB method is effective at controlling the composition and uniformity of the second dielectric material. As an example, the precursor having the larger metal ion may be used to block reaction sites and control the adsorption and incorporation of the precursor having the smaller metal ion. Additionally, the two (or more) layers may fully interdiffuse during subsequent anneal steps and the full benefit of the second dielectric material layer may be realized with regard to lowering the leakage current.

Although the sequence (302-306) is illustrated and was described wherein the precursor having the larger metal ion was introduced first, the ASB method also works wherein the precursor having the smaller metal ion is introduced first. In this sequence, the concentration of the smaller metal ion would be increased at the expense of the larger metal ion. Although the designations "large" and "small" have been used, the physical size of the metal ion may not be the criteria used to select them. In some embodiments, the metal ions of the precursors may be of similar size.

Figure 4:
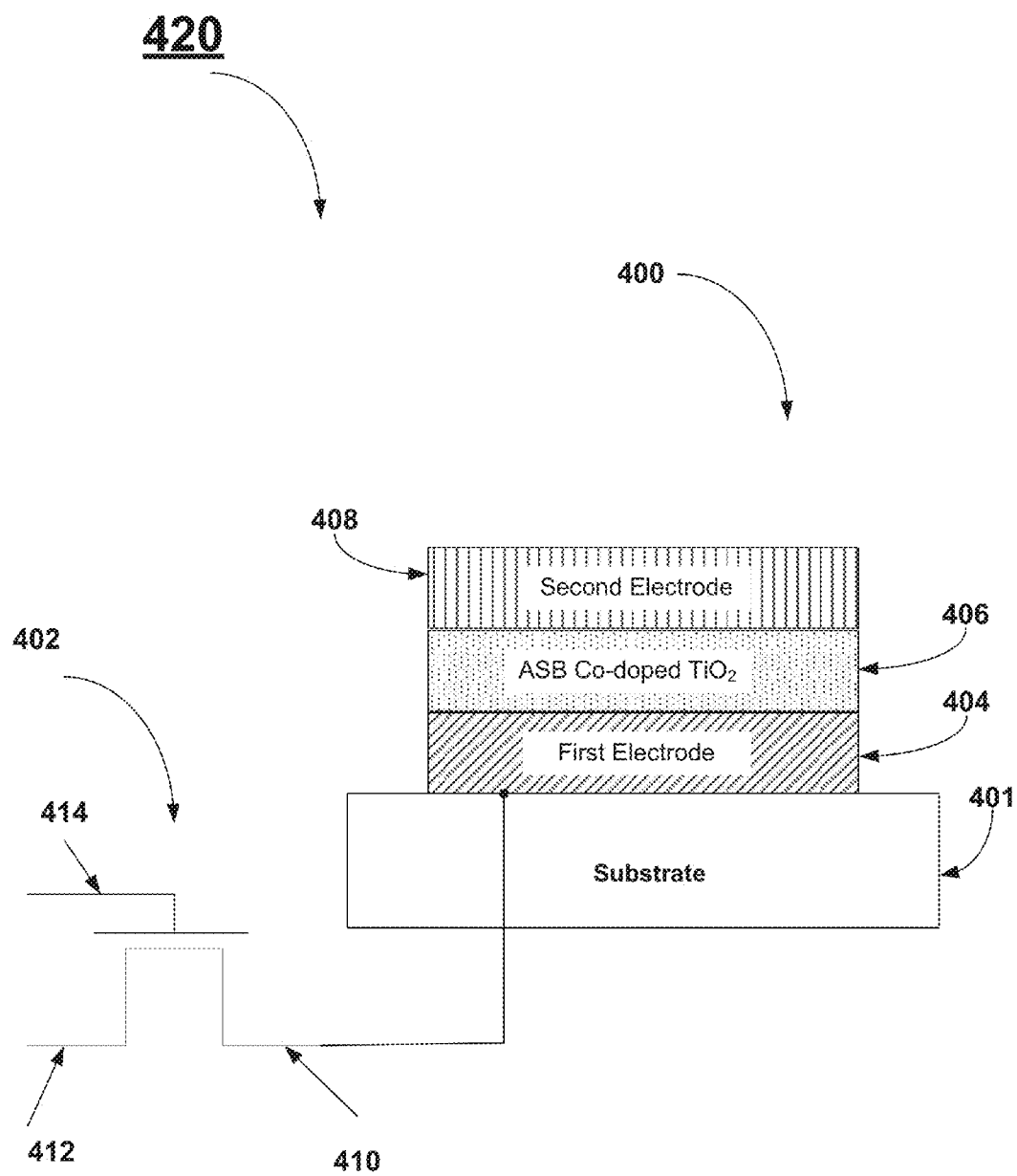
FIG. 4 illustrates a simplified cross-sectional view of a DRAM memory cell fabricated in accordance with some embodiments of the present invention.

An example of a specific application of some embodiments of the present invention is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. FIG. 4 is used to illustrate one DRAM cell, 420, manufactured using a doped high k material using the ASB method as discussed previously. The cell, 420, is illustrated schematically to include two principle components, a cell capacitor, 400, and a cell transistor, 402. The cell transistor is usually constituted by a MOS transistor having a gate, 414, source, 410, and drain, 412. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously in connection with FIGS. 2 and 3, the cell capacitor, 400, comprises a first electrode, 404, formed on substrate, 401. The first electrode, 404, is connected to the source or drain of the cell transistor, 402. For illustrative purposes, the first electrode has been connected to the source, 410, in this example. For the purposes of illustration, first electrode, 404, will be crystalline $MoO_2$ in this example. First electrode, 404, may be subjected to an anneal in a reducing atmosphere before the formation of the dielectric layer to crystallize the $MoO_2$ and to reduce any $MoO_{2+x}$ compounds that may have formed during the formation of the first electrode. Doped high k dielectric material, 406, is formed above the first electrode. Examples of suitable dielectric materials comprise $Al_2O_3$, $BaSrTiO_x$ (BST), $HfO_2$, $HfSiO_x$, $Nb_2O_5$, $PbZrTiO_x$ (PZT), $SiO_2$, a bilayer of $SiO_2$ and $Si_xN_y$, SiON, $SrTiO_3$ (STO), $Ta_2O_5$, $TiO_2$, $ZrO_2$, etc. For the purposes of illustration, doped high k material, 406, will be $TiO_2$ doped with two or more of Al, Ce, Co, Er, Ga, Gd, Ge, Hf, In, La, Lu, Mg, Mn, Nd, Pr, Sc, Si, Sn, Sr, Y, Zr using the ASB method discussed previously. Typically, the doped $TiO_2$ material is then subjected to a post dielectric anneal treatment. The second electrode, 408, is then formed above the doped $TiO_2$ material. For the purposes of illustration, the second electrode, 408, will be Co, CoN, Ir, MoN, $MoO_2$, Ni, NiN, NiO, Pt, Pd, Ru, $RuO_2$, TiN, VN, WN, or combinations thereof in this example. This completes the formation of the capacitor stack. Typically, the capacitor stack is then subjected to a post metallization anneal treatment.

Alternatively, the cell capacitor may be fabricated using the ASB method to form a second dielectric material between the doped high k material, 406, and the second electrode, 408, as described with reference to FIG. 3. The blocking layer may comprise two or more of Al, Ce, Co, Er, Ga, Gd, Ge, Hf, In, La, Lu, Mg, Mn, Nd, Pr, Sc, Si, Sn, Sr, Y, Zr. The second dielectric material will be formed using the ASB method discussed previously.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A semiconductor layer stack comprising:
   a first layer formed on a substrate,
   wherein the first layer is operable as a first electrode,
   wherein the first layer comprises crystalline $MoO_2$;
   a second layer formed on the first layer,
   wherein the second layer comprises a doped high k dielectric material,
   wherein the doped high k dielectric material is $TiO_2$ doped with at least two of Al, Ce, Co, Ga, Gd, Ge, Hf, In, La, Lu, Mg, Mn, Nd, Pr, Sc, Si, Sn, Sr, Y, or Zr;
   a third layer formed on the second layer,
   wherein the third layer comprises Sc and at least one of Al, Ce, Co, Ga, Gd, Ge, Hf, In, La, Lu, Mg, Mn, Nd, Pr, Sc, Si, Sn, Sr, Y, or Zr;
   a fourth layer formed on the third layer, wherein the fourth layer comprises a second dielectric material; and a fifth layer formed on the fourth layer,
wherein the fifth layer is operable as a second electrode.

2. The semiconductor layer stack of claim 1 wherein the second dielectric material comprises one of $Al_2O_3$, BaSrTiOx (BST), $HfO_2$, HfSiOx, $Nb_2O_5$, PbZrTiOx (PZT), $SiO_2$, a bilayer of $SiO_2$ and SixNy, SiON, $SrTiO_3$ (STO), $Ta_2O_5$, $TiO_2$, or $ZrO_2$.

3. The semiconductor layer stack of claim 2 wherein the second dielectric material comprises $TiO_2$.

4. The semiconductor layer stack of claim 1 wherein the first layer, the second layer, the third layer, and the fourth layer are annealed before the fifth layer is formed.

5. The semiconductor layer stack of claim 1 wherein the first layer, the second layer, the third layer, the fourth layer, and the fifth layer are annealed after the fifth material is formed.

6. The semiconductor layer stack of claim 1 wherein the fifth layer comprises at least one of Co, CoN, Ir, MoN, $MoO_2$, Ni, NiN, NiO, Pt, Pd, Ru, $RuO_2$, TiN, VN, or WN.

7. The semiconductor layer stack of claim 1 wherein the high k dielectric material of the second layer has a k value between about 10 and about 30.

8. The semiconductor layer stack of claim 1 wherein the second layer has a uniform distribution of dopant therein.

9. The semiconductor layer stack of claim 1 wherein the second layer comprises multiple nanolaminate sublayers, each comprising a different one of the at least two dopants.

10. A semiconductor layer stack comprising:
a first layer formed on a substrate,
wherein the first layer is operable as a first electrode,
wherein the first layer comprises crystalline $MoO_2$;
a second layer formed on the first layer,
wherein the second layer comprises a doped high k dielectric material,
wherein the doped high k dielectric material is $TiO_2$ doped with at least two of Al, Ce, Co, Ga, Gd, Ge, Hf, In, La, Lu, Mg, Mn, Nd, Pr, Sc, Si, Sn, Sr, Y, or Zr;
a third layer formed on the second layer,
wherein the third layer comprises Sc and at least one of Al, Ce, Co, Ga, Gd, Ge, Hf, In, La, Lu, Mg, Mn, Nd, Pr, Sc, Si, Sn, Sr, Y, or Zr; and
a fourth layer formed on the third layer,
wherein the fourth layer is operable as a second electrode.

11. The semiconductor layer stack of claim 10 wherein the first layer, the second layer, and the third layer are annealed before the fourth layer is formed.

12. The semiconductor layer stack of claim 10 wherein the first layer, the second layer, the third layer, and the fourth layer are annealed after the fourth layer is formed.

13. The semiconductor layer stack of claim 10 wherein the fourth layer comprises at least one of Co, CoN, Ir, MoN, $MoO_2$, Ni, NiN, NiO, Pt, Pd, Ru, $RuO_2$, TiN, VN, or WN.

14. The semiconductor layer stack of claim 10 wherein the high k dielectric material of the second layer has a k value between about 10 and about 30.

15. The semiconductor layer stack of claim 10 wherein the second layer comprises a uniform distribution of dopant therein.

16. The semiconductor layer stack of claim 10 wherein the second layer comprises multiple nanolaminate sublayers, each comprising a different one of the at least two dopants.

* * * * *